United States Patent
Su et al.

(10) Patent No.: US 9,477,804 B2
(45) Date of Patent: Oct. 25, 2016

(54) INTEGRATED CIRCUIT DESIGN METHOD (71) Applicant: TAIWAN SEMICONDUCTOR MANUFACTURING CO., LTD., Hsinchu (TW)

(72) Inventors: Chuan-Fang Su, Tainan (TW); Kun-Zhi Chung, Hsinchu (TW); Yuan-Hsiang Lung, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/600,970

(22) Filed: Jan. 20, 2015

(65) Prior Publication Data
US 2016/0210395 A1 Jul. 21, 2016

(51) Int. Cl.
*G06F 17/50* (2006.01)
(52) U.S. Cl.
CPC ................... *G06F 17/5081* (2013.01)
(58) Field of Classification Search
CPC ........... G06F 17/5081; G06F 17/5068; G06F 17/5072; G03F 1/144; G03F 1/36; G03F 7/70466
See application file for complete search history.

(56) References Cited

U.S. PATENT DOCUMENTS

| | | | |
|---|---|---|---|
| 6,664,010 B2* | 12/2003 | Ahrens | G03F 1/144 430/5 |
| 8,871,104 B2* | 10/2014 | Park | H01L 21/0337 216/41 |
| 9,087,174 B1* | 7/2015 | Zhang | G06F 17/5081 |
| 2011/0318927 A1* | 12/2011 | Li | G03F 1/36 438/692 |
| 2014/0162460 A1* | 6/2014 | Lee | H01L 21/3086 438/703 |
| 2014/0215421 A1* | 7/2014 | Chen | G06F 17/5081 716/112 |
| 2014/0264760 A1* | 9/2014 | Chang | G06F 17/5072 257/618 |

OTHER PUBLICATIONS

"Self-aligned Double Patterning Layout Decomposition with Complementary E-Beam Lithography", by Jhih-Rong Gao, Bei Yu, and David Z. Pan, @IEEE 2014.*
Pending U.S. Appl. No. 14/262,082, filed Apr. 25, 2014.

* cited by examiner

Primary Examiner — Nha Nguyen
(74) Attorney, Agent, or Firm — Maschoff Brennan (57) ABSTRACT An IC design method includes: receiving a first layout including a first pattern; receiving a second layout including a second pattern, the first pattern separated from the second pattern when overlapping the first layout and the second layout; providing a cut pattern between the first pattern and the second pattern and overlapping the first pattern when overlapping the first layout, the second layout and the cut pattern; and providing a jog extending from the cut pattern to further overlap the first pattern with a length when a spacing between the second pattern and an edge of the cut pattern overlapping the first pattern is lower than a predetermined value, in which a ratio of the length of the jog to the spacing between the second pattern and the edge of the cut pattern overlapping the first pattern is in a range of 1/5 to 1/1.

20 Claims, 6 Drawing Sheets

INTEGRATED CIRCUIT DESIGN METHOD

BACKGROUND

The semiconductor integrated circuit (IC) industry has experienced rapid growth. In semiconductor manufacturing, functional density is generally increasing with reduced geometry size, and smaller and more complex integrated circuits than the previous generation are produced. This scaling down process generally provides benefits by increasing production efficiency and lowering associated costs. However, such scaling down also increases the processing and manufacturing complexity of integrated circuits. For these advances to be realized, associated developments are required in the processing and manufacturing of the integrated circuits.

For example, as IC technologies are continually progressing to smaller technology nodes, such as 65 nm technology node, 45 nm technology node, 20 nm technology node and below, simply scaling down similar designs used at larger feature sizes often results in poorly shaped or poorly arranged device features. Typically, optical proximity correction (OPC) may be performed on a design pattern before the pattern is created on a mask. Nevertheless, current OPC techniques may not offer great enough fidelity or sufficient rules to correct problems in sub-45 nm designs. Therefore, although existing methods for improving IC manufacturing have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit (IC) manufacturing system includes a plurality of entities, such as a design house, a mask house, and an IC fabrication entity (i.e., a fab), that interact with one another in the design, development, and manufacturing cycles and/or services related to manufacturing an IC device. The plurality of entities are connected by a communications network, which may be a single network or a variety of different networks, such as an intranet and the Internet, and may include wired and/or wireless communication channels. Each entity may interact with other entities and may provide services to and/or receive services from the other entities. The design house, mask house, and IC fabrication entity may be a single entity or separate entities.

The design house generates an IC design layout. The IC design layout includes various geometrical patterns designed for an IC product, based on a specification of the IC product to be manufactured. The geometrical patterns correspond to patterns of metal, oxide, or semiconductor layers that make up the various components of the IC device to be fabricated. The various layers combine to form various IC features. For example, a portion of the IC design layout includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The design house implements a proper design procedure to form the IC design layout. The design procedure may include logic design, physical design and/or schematic design.

The mask house receives the IC design layout from the design house. The mask house uses the IC design layout to manufacture one or more masks to be used for fabricating the various layers of the IC product according to the IC design layout. The mask house performs mask data preparation and mask fabrication to fabricate a mask according to the IC design layout. Specifically, the IC design layout is translated into a form that can be physically written by a mask writer, and then modified by a data preparation process to comply with a particular mask writer and/or mask manufacturer. After the data preparation process, a mask or a set of masks is fabricated using the mask fabrication process.

For instance, an electron-beam (e-beam), or a mechanism of multiple energy beams is used as an exposure source to form a patterned mask.

An IC fabrication entity, such as a semiconductor foundry, uses the mask (or masks) fabricated by the mask house to fabricate the IC device. The IC fabrication entity is an IC fabrication business that can include a myriad of manufacturing facilities for the fabrication of a variety of different IC products. For example, there may be a manufacturing facility for the front end fabrication of a plurality of IC products (i.e., front-end-of-line (FEOL) fabrication), while a second manufacturing facility may provide the mid and/or back end fabrication for the metal contact, interconnection, and packaging of the IC products (i.e., mid-end-of-line (MEOL) and back-end-of-line (BEOL) fabrication), and a third manufacturing facility may provide other services for the foundry business.

In the present disclosure, a semiconductor wafer is fabricated using one or more masks to form an IC device. The semiconductor wafer includes a silicon substrate or other proper substrate having material layers formed thereon. Other proper substrate materials include another suitable elementary semiconductor including germanium in crystal, polycrystalline, or an amorphous structure; a compound semiconductor including silicon carbide, gallium arsenide, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or a combination thereof. The semiconductor wafer may further include various doped regions, dielectric features, and multilevel interconnects (formed at subsequent manufacturing operations). The mask may be used in a variety of processes. For example, the mask may be used in an ion implantation process to form various doped regions in the semiconductor wafer, in an etching process to form various etching regions in the semiconductor wafer, in a deposition process (e.g., chemical vapor deposition (CVD) or physical vapor deposition (PVD)) to form a thin film in various regions on the semiconductor wafer, and/or other suitable operations.

As mentioned in the background, current optical proximity correction (OPC) techniques may not offer great enough fidelity or sufficient rules to correct problems in sub-45 nm designs. For instance, if a feature for forming an interconnect, at the IC design layout stage, is designed on a first mask for being lower than a value away from another feature for forming an adjacent interconnect on a second mask when the first mask overlaps the second mask, device performance (e.g., voltage breakdown) may be deteriorated.

Figure 1:
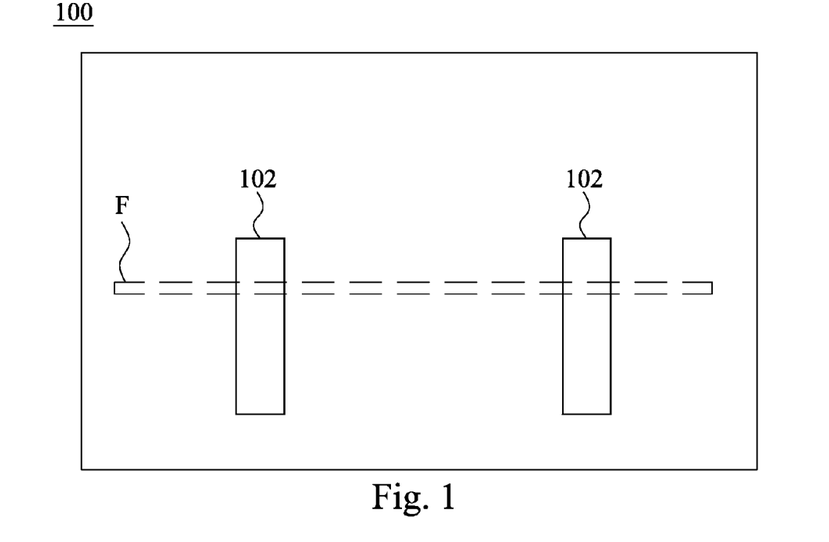
FIG. 1 is a top view of an exemplified first layout in accordance with some embodiments of the present disclosure.
Figure 2:
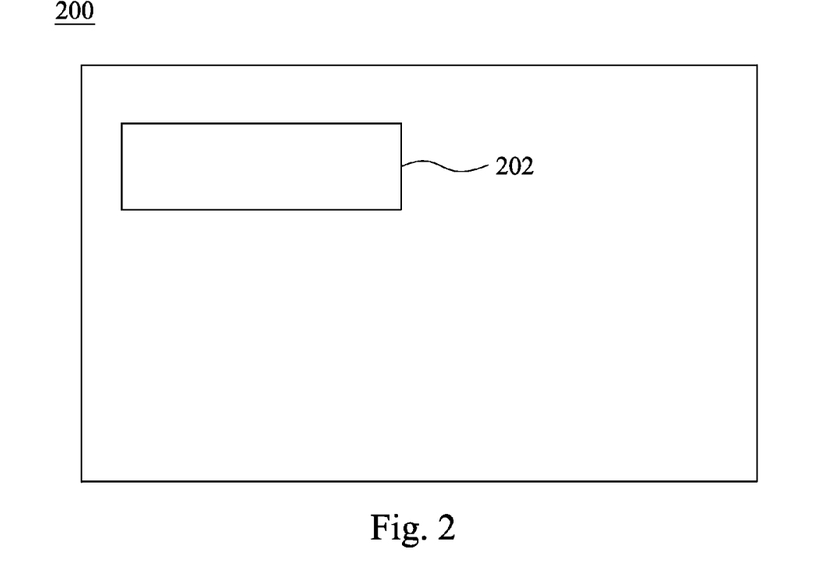
FIG. 2 is a top view of an exemplified second layout in accordance with some embodiments of the present disclosure.
Figure 3:
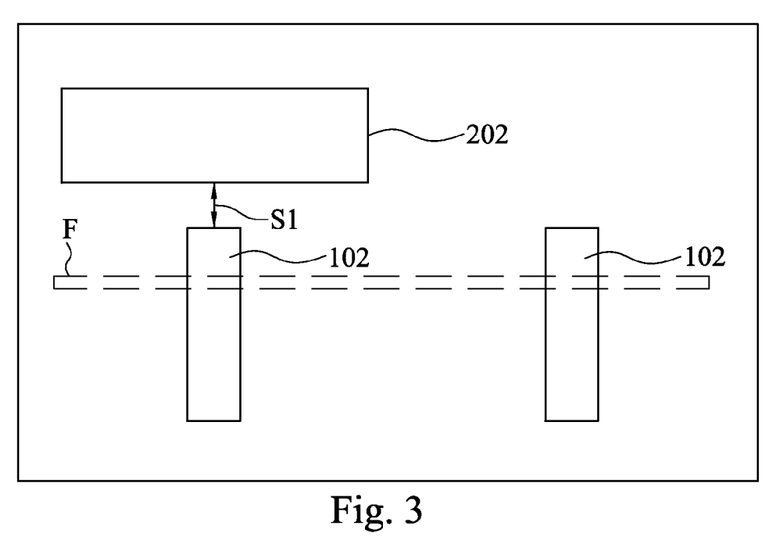
FIG. 3 is a stacked layout of FIGS. 1 and 2 in accordance with some embodiments of the present disclosure.

FIG. 1 is a top view of an exemplified first layout 100 in accordance with some embodiments of the present disclosure. The first layout 100 includes a first pattern 102. In some embodiments, the first pattern 102 is configured to form an element (not shown) across a fin structure F. FIG. 2 is a top view of an exemplified second layout 200 in accordance with some embodiments of the present disclosure. The second layout 200 includes a second pattern 202. In some embodiments, the second pattern 202 is configured to form another element (not shown). FIG. 3 is a stacked layout of FIGS. 1 and 2 in accordance with some embodiments of the present disclosure. The first pattern 102 is separated from the second pattern 202 with a spacing S1 therebetween when the first layout 100 of FIG. 1 overlaps the second layout 200 of FIG. 2. However, the spacing S1 may be too small to maintain sufficient device performance (e.g., voltage breakdown). One solution is to shorten the first pattern 102 to increase the spacing S1, but the formed element corresponding to the first pattern 102 may fail to cross the fin structure F. Another solution is to narrow the second pattern 202 to increase the spacing S1, but electrical performance (e.g., resistance) of the formed element corresponding to the second pattern 202 may be affected.

In view of the foregoing, the present disclosure provides an IC design method for controlling a spacing between two formed elements respectively corresponding to two patterns (e.g., the first pattern 102 and the second 202 of FIG. 3) using a cut pattern and a jog rule to maintain device performance and to improve process window. Embodiments of the IC design method for controlling the spacing will be described below in detail.

Figure 4:
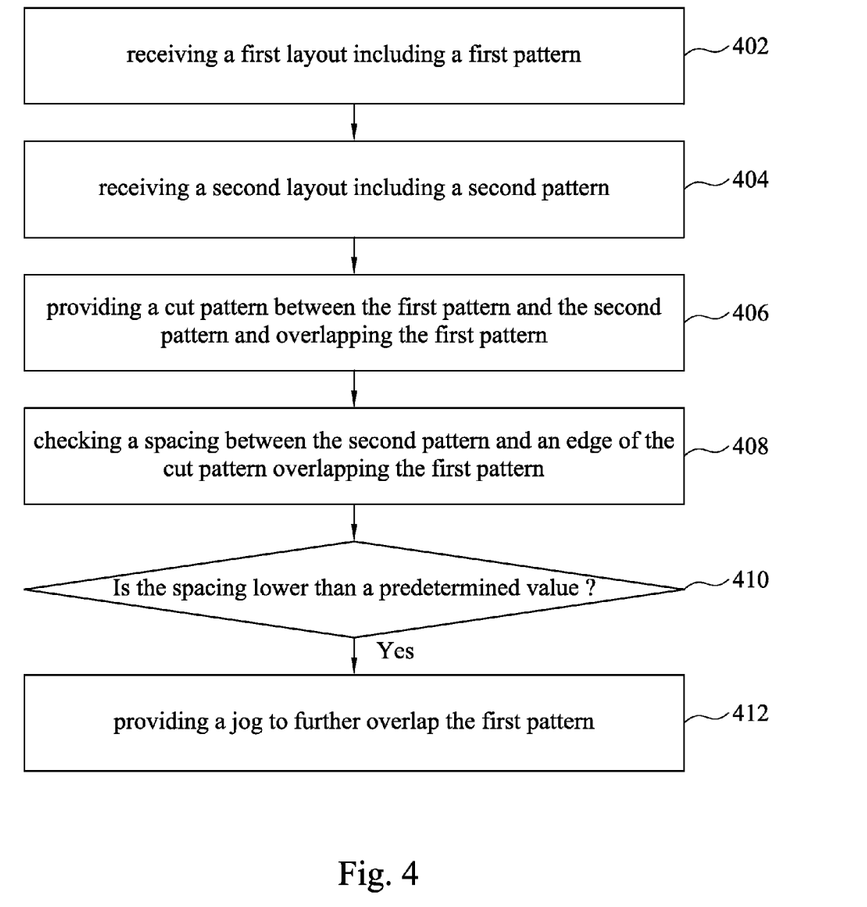
FIG. 4 is a flowchart of an IC design method in accordance with some embodiments of the present disclosure.

FIG. 4 is a flowchart of an IC design method in accordance with some embodiments of the present disclosure. Referring to FIGS. 1 and 4, in operation 402, a first layout 100 is received, which includes a first pattern 102. In some embodiments, the first layout 100 includes a plurality of first patterns 102 substantially parallel to each other. In some embodiments, the first pattern 102 is a stripe pattern. In some embodiments, the first pattern 102 is configured to form a first interconnect (not shown) across the fin structure F. In some embodiments, the first pattern 102 is configured to form the first interconnect electrically connected to the fin structure F (or called as an oxide-defined (OD) region). In some embodiments, the fin structure F includes a source/drain region. In some embodiments, the first pattern 102 is configured to form the first interconnect electrically connected to a drain region.

Referring to FIGS. 2 and 4, in operation 404, a second layout 200 is received, which includes a second pattern 202. In some embodiments, the second pattern 202 is a stripe pattern. In some embodiments, the second pattern 202 is a stripe pattern along a direction different from that of the first pattern 102. In some embodiments, the second pattern 202 is configured to form a second interconnect (not shown) electrically connected to a gate (not shown). In some embodiments, the gate crosses the fin structure F of FIG. 1. In some embodiments, the formed first and second interconnects respectively corresponding to the first and second patterns 102, 202 are formed over a fin field-effect transistor (FinFET).

Figure 5:
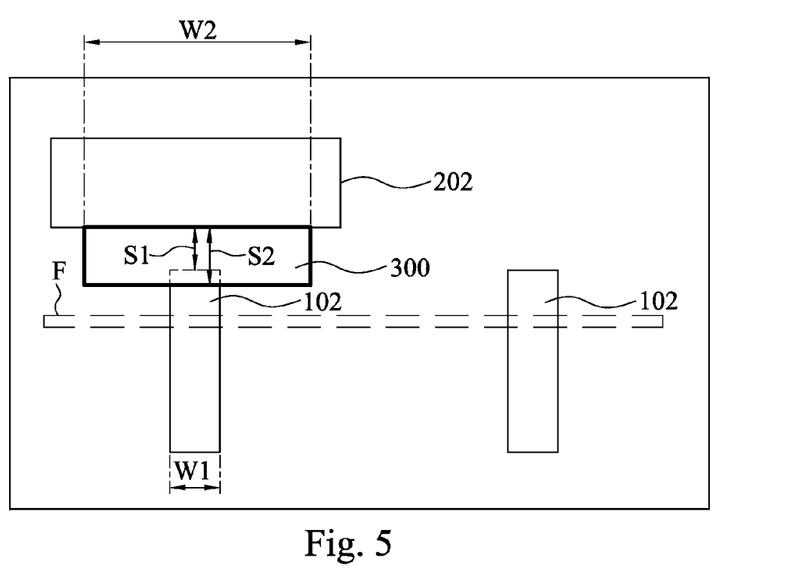
FIG. 5 is a stacked layout of FIGS. 1 and 2 and a cut pattern in accordance with some embodiments of the present disclosure.

Referring to FIGS. 3 and 4, the spacing S1 may be too small to maintain sufficient device performance; therefore, in operation 406, a cut pattern between the first pattern 102 and the second pattern 202 and overlapping the first pattern 102 is provided to shorten the formed first interconnect corresponding to the first pattern 102, and thus to increase a final spacing between the first interconnect and the second interconnect to maintain the device performance. FIG. 5 is a stacked layout of FIGS. 1 and 2 and a cut pattern in accordance with some embodiments of the present disclosure. As shown in FIG. 5, a cut pattern 300 is provided between the first pattern 102 and the second pattern 202 and overlapping the first pattern 102. In some embodiments, the cut pattern 300 is in any arbitrary shape, such as a polygon, circle, ellipse or other non-rectangular shape. In some embodiments, the cut pattern 300 has a width W2 greater than a width W1 of the first pattern 102 to avoid incomplete cutting when the first interconnect is formed. In some embodiments, the cut pattern 300 is provided by an OPC rule. In some embodiments, the first pattern 102 corresponds to a hole of a mask, and the cut pattern 300 corresponds to an island of another mask, and a patterning process using the masks is performed to form the first interconnect. In some embodiments, the second pattern 202 corresponds to a hole of a mask, and a patterning process using the mask is performed to form the second interconnect separated form the first interconnect.

However, as shown in FIG. 5, a spacing S2 corresponding to the final spacing between the first interconnect and the second interconnect may still not be enough to maintain the device performance. Therefore, referring to FIGS. 4 and 5, in operation 408, the spacing S2 between the second pattern 202 and an edge of the cut pattern 300 overlapping the first pattern 102 is checked. Subsequently, in operation 410, a comparison between the spacing S2 and a predetermined value is performed to decide whether to perform a jog rule (i.e., the following operation 412) to further increase the final spacing between the first interconnect and the second interconnect to maintain the device performance.

In some embodiments, the predetermined value is determined by one or more characteristic tests, such as a voltage breakdown test. For example, a plurality of samples including the first and second interconnects with various spacing S2 at the IC design stage are prepared. A characteristic test such as a voltage breakdown test is performed on the samples. According to the test results, some of the samples with the spacing S2 at the IC design stage lower than a specific value may have voltage breakdown lower than a specification value, and thus the specific value can be considered as the predetermined value of operation 410.

In some embodiments, the predetermined value is lower than or equal to 40 nm, 39 nm, 38 nm, 37 nm, 36 nm, 35 nm, 34 nm or another suitable value. For example, some samples including the first and second interconnects with the spacing S2 at the IC design stage lower than 40 nm result in voltage breakdown lower than a specification value, and thus the predetermined value is 40 nm. For another example, some samples including the first and second interconnects with the spacing S2 at the IC design stage lower than 34 nm result in voltage breakdown lower than a specification value, and thus the predetermined value is 34 nm. In other words, the predetermined value may be altered in accordance with different specification requirements.

Referring to FIGS. 4 and 5, if the result of operation 410 is "No" (i.e., the spacing S2 is greater than or equal to the predetermined value), the first pattern 102, the second pattern 202 and the cut pattern 300 of FIG. 5 are qualified and can be transferred to the mask house to form masks. If the result of operation 410 is "Yes" (i.e., the spacing S2 is lower than the predetermined value), operation 412 will be performed.

Figure 6:
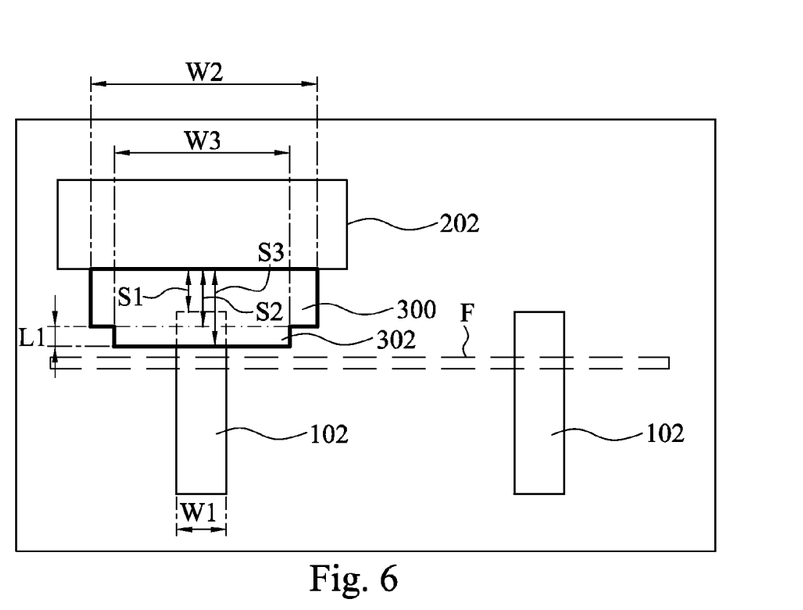
FIG. 6 is a stacked layout of FIGS. 1 and 2, a cut pattern and a jog in accordance with some embodiments of the present disclosure.

Referring to FIGS. 4 and 5, in operation 412, when the result of operation 410 is "Yes", a jog extending from the cut pattern 300 to further overlap the first pattern 102 is provided to further increase the final spacing between the first interconnect and the second interconnect to maintain the device performance. FIG. 6 is a stacked layout of FIGS. 1 and 2, a cut pattern and a jog in accordance with some embodiments of the present disclosure. As shown in FIG. 6, the jog 302 extending from the cut pattern 300 to further overlap the first pattern 102 is provided. In some embodiments, the jog 302 is in any arbitrary shape, such as a polygon, circle, ellipse or other non-rectangular shape.

In some embodiments, the jog 302 has a length L1, which refers to an extended length of the jog 302. In other words, the length L1 refers to a distance between an edge of the jog 302 connected to the cut pattern 300 and an opposite edge of the jog 302. In some embodiments, a ratio of the length L1 to the spacing S2 is in a range of 1/5 to 1/1. In some embodiments, the ratio of the length L1 to the spacing S2 is greater than or equal to 1/4. In some embodiments, the ratio of the length L1 to the spacing S2 is greater than or equal to 1/3.5. In some embodiments, the spacing S2 is in a range of 24 nm to 30 nm. In some embodiments, the spacing S2 is in a range of 25 nm to 29 nm. In some embodiments, the spacing S2 is in a range of 26 nm to 28 nm.

In some embodiments, the length L1 is determined by calculating the predetermined value and the spacing S2. In some embodiments, the length L1 is greater than or equal to the predetermined value minus the spacing S2. In some embodiments, the length L1 is equal to the predetermined value minus the spacing S2. In some embodiments, the length L1 is greater than 5 nm. In some embodiments, the spacing S2 is greater than 25 nm. In some embodiments, the length L1 is greater than or equal to 7 nm, and the spacing S2 is greater than or equal to 26 nm, and thus a spacing S3 between the second pattern 202 and an edge of the jog 302 away from the second pattern 202 is greater than or equal to 33 nm to let voltage breakdown of the formed first and second interconnects be greater than or equal to a specific value. In some embodiments, the length L1 is greater than or equal to 8 nm, and the spacing S2 is greater than or equal to 26 nm, and thus the spacing S3 is greater than or equal to 34 nm to let voltage breakdown of the formed first and second interconnects be greater than or equal to a specific value.

In some embodiments, the jog 302 has a width W3 greater than the width W1 of the first pattern 102 to avoid incomplete cutting when the first interconnect is formed. In some embodiments, a ratio of the width W3 of the jog 302 to the width W1 of the first pattern 102 is greater than or equal to 3/1. In some embodiments, the ratio of the width W3 of the jog 302 to the width W1 of the first pattern 102 is greater than or equal to 5/1. In some embodiments, the width W3 of the jog 302 is lower than or equal to the width W2 of the cut pattern 300.

Although the embodiments of the present disclosure describe the features (e.g., the first pattern 102 and second pattern 202) on the IC design layout, the IC design layout encompassed by the scope of the present disclosure can include various geometrical patterns representing features of an integrated circuit. For example, the IC design layout may include main IC features such as active regions, gate electrodes, sources and drains, metal lines, interlayer interconnection vias, and openings for bonding pads that may be formed in a semiconductor substrate (e.g., a semiconductor wafer) and various material layers disposed over the semiconductor substrate. The IC design layout may also include certain assist features, such as those features for imaging effect, processing enhancement, and/or mask identification information. People having ordinary skill in the art may understand that the IC design method can include other operations of receiving other layouts, and the layouts can be overlaid for further operations.

Figure 7:
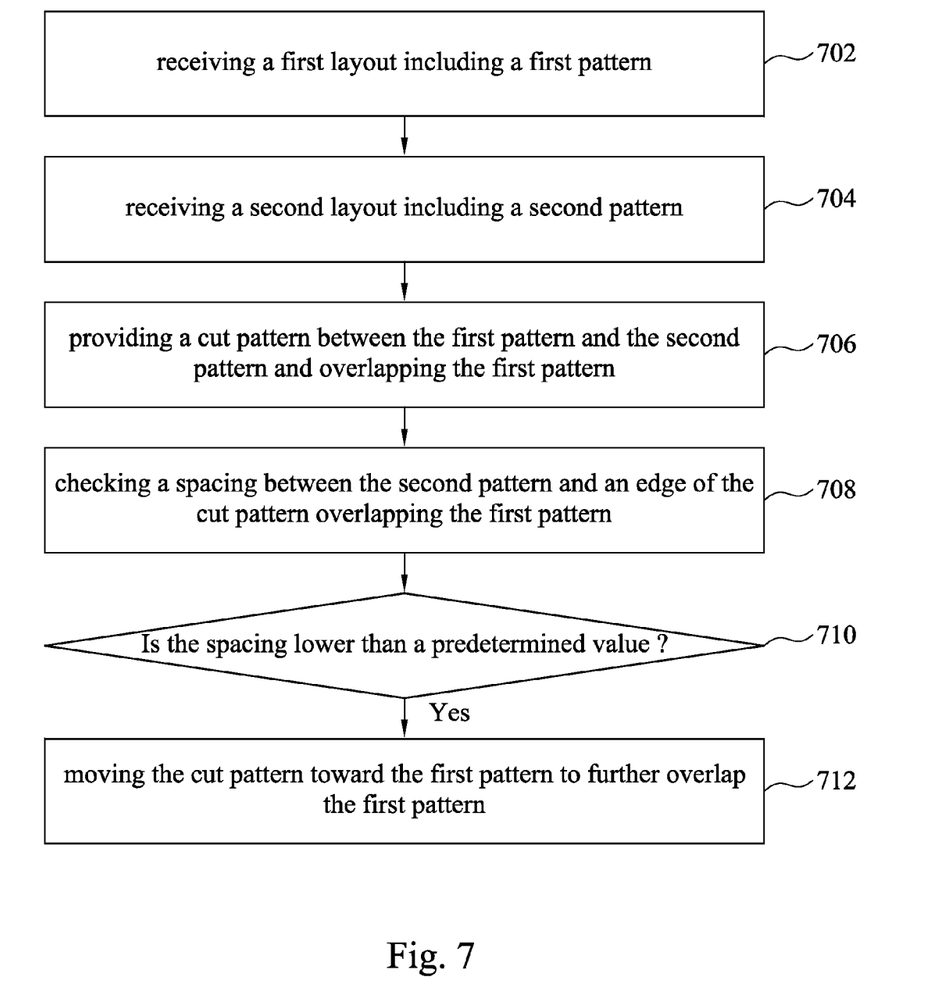
FIG. 7 is a flowchart of an IC design method in accordance with some embodiments of the present disclosure.

FIG. 7 is a flowchart of an IC design method in accordance with some embodiments of the present disclosure. Referring to FIGS. 1 and 7, in operation 702, a first layout 100 is received, which includes a first pattern 102. In some embodiments, the first pattern 102 is configured to form a first interconnect across a fin structure F. In some embodiments, the first pattern 102 is configured to form the first interconnect electrically connected to the fin structure F. Other embodiments of operation 702 may refer to the above embodiments of operation 402.

Referring to FIGS. 2 and 7, in operation 704, a second layout 200 is received, which includes a second pattern 202. In some embodiments, the second pattern 202 is configured to form a second interconnect electrically connected to a gate (not shown). Other embodiments of operation 704 may refer to the above embodiments of operation 404.

Referring to FIG. 3, a spacing S1 between the first and second patterns 102, 202 when the first layout 100 overlaps the second layout 200 may be too small to maintain sufficient device performance. Therefore, referring to FIGS. 5 and 7, in operation 706, a cut pattern 300 is provided between the first pattern 102 and the second pattern 202 and overlapping the first pattern 102 to shorten the formed first interconnect corresponding to the first pattern 102, and thus to increase a final spacing between the first interconnect and the second interconnect to maintain the device performance. Embodiments of operation 706 may refer to the above embodiments of operation 406.

However, as shown in FIG. 5, a spacing S2 corresponding to the final spacing between the first interconnect and the second interconnect may still not be enough to maintain the device performance. Therefore, referring to FIGS. 5 and 7, in operation 708, the spacing S2 between the second pattern 202 and an edge of the cut pattern 300 overlapping the first pattern 102 is checked. Subsequently, in operation 710, a comparison between the spacing S2 and a predetermined value is performed to decide whether to move the cut pattern 300 (i.e., the following operation 712) to further increase the final spacing between the first interconnect and the second interconnect to maintain the device performance. In some embodiments, the predetermined value is lower than or equal to 40 nm, 39 nm, 38 nm, 37 nm, 36 nm, 35 nm, 34 nm or another suitable value.

Referring to FIGS. 5 and 7, if the result of operation 710 is "No" (i.e., the spacing S2 is greater than or equal to the predetermined value), the first pattern 102, the second pattern 202 and the cut pattern 300 of FIG. 5 are qualified and can be transferred to the mask house to form masks. If the result of operation 710 is "Yes" (i.e., the spacing S2 is lower than the predetermined value), operation 712 will be performed.

Figure 8:
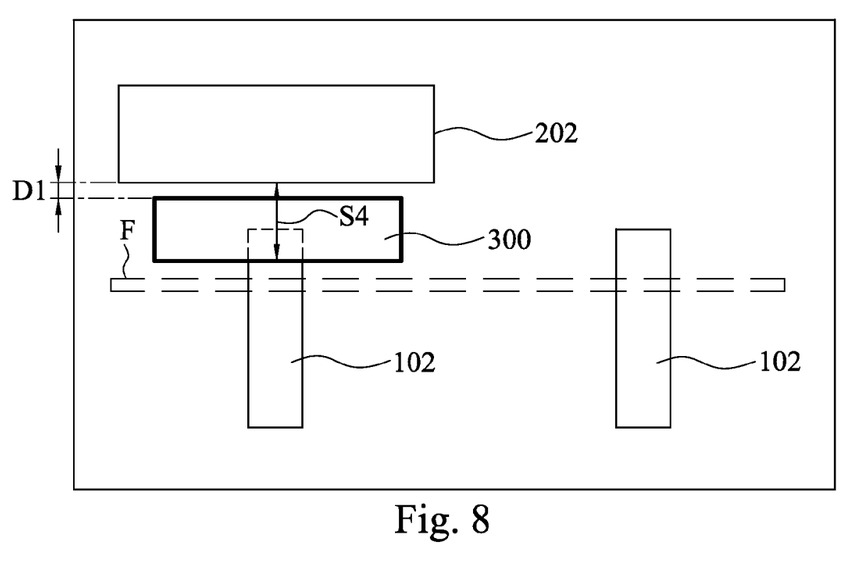
FIG. 8 is a stacked layout of FIGS. 1 and 2 and a cut pattern in accordance with some embodiments of the present disclosure.

Referring to FIGS. 5 and 7, when the result of operation 710 is "Yes", the cut pattern 300 is moved toward the first pattern 102 to further overlap the first pattern 102, and thus to increase the final spacing between a first interconnect and a second interconnect to maintain the device performance. FIG. 8 is a stacked layout of FIGS. 1 and 2 and a cut pattern in accordance with some embodiments of the present disclosure. Referring to FIGS. 5 and 8, the cut pattern 300 is moved toward the first pattern 102 with a distance D1 to further overlap the first pattern 102.

Referring to FIGS. 5 and 8, in some embodiments, a ratio of the distance D1 to the spacing S2 is in a range of 1/5 to 1/1. In some embodiments, the ratio of the distance D1 to the spacing S2 is greater than or equal to 1/4. In some embodiments, the ratio of the distance D1 to the spacing S2 is greater than or equal to 1/3.5.

In some embodiments, the distance D1 is determined by calculating the predetermined value and the spacing S2. In some embodiments, the distance D1 is greater than or equal to the predetermined value minus the spacing S2. In some embodiments, the distance D1 is equal to the predetermined value minus the spacing S2. In some embodiments, the distance D1 is greater than 5 nm. In some embodiments, the spacing S2 is greater than 25 nm. In some embodiments, the distance D1 is greater than or equal to 7 nm, and the spacing S2 is greater than or equal to 26 nm, and thus a spacing S4 between the second pattern 202 and an edge of the cut pattern 300 away from the second pattern 202 is greater than or equal to 33 nm to let voltage breakdown of the formed first and second interconnects be greater than or equal to a specific value. In some embodiments, the distance D1 is greater than or equal to 8 nm, and the spacing S2 is greater than or equal to 26 nm, and thus the spacing S4 is greater than or equal to 34 nm to let voltage breakdown of the formed first and second interconnects be greater than or equal to a specific value. However, it should be noted that the distance D1 might not be greater than a value; otherwise, an end of the first pattern 102 adjacent to the second pattern 202 will be exposed.

According to some embodiments, an IC design method includes: receiving a first layout including a first pattern; receiving a second layout including a second pattern, the first pattern separated from the second pattern when overlapping the first layout and the second layout; providing a cut pattern between the first pattern and the second pattern and overlapping the first pattern when overlapping the first layout, the second layout and the cut pattern; and providing a jog extending from the cut pattern to further overlap the first pattern with a length when a spacing between the second pattern and an edge of the cut pattern overlapping the first pattern is lower than a predetermined value, in which a ratio of the length of the jog to the spacing between the second pattern and the edge of the cut pattern overlapping the first pattern is in a range of 1/5 to 1/1.

According to some embodiments, an IC design method includes: receiving a first layout including a first pattern; receiving a second layout including a second pattern, the first pattern separated from the second pattern when overlapping the first layout and the second layout; providing a cut pattern between the first pattern and the second pattern and overlapping the first pattern when overlapping the first layout, the second layout and the cut pattern; and providing a jog extending from the cut pattern to further overlap the first pattern when a spacing between the second pattern and an edge of the cut pattern overlapping the first pattern is lower than a predetermined value of lower than or equal to 40 nm.

According to some embodiments, an IC design method includes: receiving a first layout including a first pattern; receiving a second layout including a second pattern, the first pattern separated from the second pattern when overlapping the first layout and the second layout; providing a cut pattern between the first pattern and the second pattern and overlapping the first pattern when overlapping the first layout, the second layout and the cut pattern; and moving the cut pattern toward the first pattern to further overlap the first pattern with a distance when a spacing between the second pattern and an edge of the cut pattern overlapping the first pattern is lower than a predetermined value, in which a ratio of the distance to the spacing between the second pattern and the edge of the cut pattern overlapping the first pattern is in a range of 1/5 to 1/1.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) design method, the method comprising:
    receiving a first layout comprising a first pattern;
    receiving a second layout comprising a second pattern, the first pattern separated from the second pattern when the first layout and the second layout are overlapped, wherein the first pattern has an edge portion adjacent to the second pattern;
    providing a cut pattern overlapping the edge portion of the first pattern when the first layout, the second layout, and the cut pattern are overlapped; and
    providing a jog extending from the cut pattern to further overlap the edge portion of the first pattern with a length, the jog being provided when a spacing between the second pattern and an edge of the cut pattern overlapping the edge portion of the first pattern is lower than a predetermined value, wherein a ratio of the length of the jog to the spacing between the second pattern and the edge of the cut pattern overlapping the edge portion of the first pattern is in a range of 1/5 to 1/1; and
    manufacturing one or more masks using the first pattern, the second pattern, and the cut pattern with the jog, the one or more masks to be used to fabricate one or more layers of an integrated circuit product.

2. The IC design method of claim 1, wherein the ratio of the length of the jog to the spacing between the second pattern and the edge of the cut pattern overlapping the edge portion of the first pattern is greater than or equal to 1/4.

3. The IC design method of claim 1, wherein the ratio of the length of the jog to the spacing between the second pattern and the edge of the cut pattern overlapping the edge portion of the first pattern is greater than or equal to 1/3.5.

4. The IC design method of claim 1, wherein the spacing between the second pattern and the edge of the cut pattern overlapping the edge portion of the first pattern is in a range of 24 nm to 30 nm.

5. The IC design method of claim 1, wherein a ratio of a width of the jog to a width of the first pattern is greater than or equal to 3/1.

6. The IC design method of claim 1, wherein a ratio of a width of the jog to a width of the first pattern is greater than or equal to 5/1.

7. An IC design method, the method comprising:
    receiving a first layout comprising a first pattern;
    receiving a second layout comprising a second pattern, the first pattern separated from the second pattern when the first layout and the second layout are overlapped, wherein the first pattern has an edge portion adjacent to the second pattern;
    providing a cut pattern overlapping the edge portion of the first pattern when the first layout, the second layout and the cut pattern are overlapped; and
    providing a jog extending from the cut pattern to further overlap the edge portion of the first pattern when a spacing between the second pattern and an edge of the cut pattern overlapping the edge portion of the first pattern is lower than a predetermined value of that is lower than or equal to 40 nm; and
    manufacturing one or more masks using the first pattern, the second pattern, and the cut pattern with the jog, the one or more masks to be used to fabricate one or more layers of an integrated circuit product.

8. The IC design method of claim 7, wherein the predetermined value is lower than or equal to 34 nm.

9. The IC design method of claim 7, wherein providing the jog comprises providing the jog extending from the cut pattern to further overlap the edge portion of the first pattern with a length when the spacing between the second pattern and the edge of the cut pattern overlapping the edge portion of the first pattern is lower than the predetermined value, and a ratio of the length of the jog to the spacing between the second pattern and the edge of the cut pattern overlapping the edge portion of the first pattern is in a range of 1/5 to 1/1.

10. The IC design method of claim 7, wherein providing the jog comprises providing the jog extending from the cut pattern to further overlap the edge portion of the first pattern with a length when the spacing between the second pattern and the edge of the cut pattern overlapping the edge portion of the first pattern is lower than the predetermined value, and a ratio of the length of the jog to the spacing between the second pattern and the edge of the cut pattern overlapping the edge portion of the first pattern is greater than or equal to 1/4.

11. The IC design method of claim 7, wherein providing the jog comprises providing the jog extending from the cut pattern to further overlap the edge portion of the first pattern with a length when the spacing between the second pattern and the edge of the cut pattern overlapping the edge portion of the first pattern is lower than the predetermined value, and the length of the jog is greater than or equal to 7 nm.

12. The IC design method of claim 11, wherein the spacing between the second pattern and the edge of the cut pattern overlapping the edge portion of the first pattern is greater than or equal to 26 nm.

13. The IC design method of claim 7, wherein the first pattern is a stripe pattern.

14. The IC design method of claim 7, wherein a ratio of a width of the jog to a width of the first pattern is greater than or equal to 3/1.

15. The IC design method of claim 7, wherein a ratio of a width of the jog to a width of the first pattern is greater than or equal to 5/1.

16. The IC design method of claim 7, wherein the first pattern is configured to form a first interconnect electrically connected to a fin structure.

17. The IC design method of claim 7, wherein the first pattern is configured to form a first interconnect across a fin structure.

18. The IC design method of claim 7, wherein the second pattern is configured to form a second interconnect electrically connected to a gate.

19. An IC design method, the method comprising:
    receiving a first layout comprising a first pattern;
    receiving a second layout comprising a second pattern, the first pattern separated from the second pattern when the first layout and the second layout are overlapped, wherein the first pattern has an edge portion adjacent to the second pattern;
    providing a cut pattern overlapping the edge portion of the first pattern when the first layout, the second layout and the cut pattern are overlapped; and
    moving the cut pattern toward the first pattern to further overlap the edge portion of the first pattern with a distance when a spacing between the second pattern and an edge of the cut pattern overlapping the edge portion of the first pattern is lower than a predetermined value, wherein a ratio of the distance to the spacing between the second pattern and the edge of the cut pattern overlapping the edge portion of the first pattern is in a range of 1/5 to 1/1; and manufacturing one or more masks using the first pattern, the second pattern, and the cut pattern, the one or more masks to be used to fabricate one or more layers of an integrated circuit product.

20. The IC design method of claim 19, wherein the ratio of the distance to the spacing between the second pattern and the edge of the cut pattern overlapping the edge portion of the first pattern is greater than or equal to 1/4.

* * * * *